(12) United States Patent
Shealy

(10) Patent No.: US 6,560,452 B1
(45) Date of Patent: May 6, 2003

(54) OSCILLATOR HAVING A TRANSISTOR FORMED OF A WIDE BANDGAP SEMICONDUCTOR MATERIAL

(75) Inventor: Jeffrey B. Shealy, Huntersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 233 days.

(21) Appl. No.: 09/723,274

(22) Filed: Nov. 27, 2000

(51) Int. Cl.[7] .............................. H04B 1/10; H03B 19/00
(52) U.S. Cl. ..................... 455/333; 455/118; 331/117 R
(58) Field of Search ........................... 455/333, 76, 112, 455/118, 119; 331/23, 117 R, 117 V, 117 FE, 108 C

(56) References Cited

U.S. PATENT DOCUMENTS

| | | | |
|---|---|---|---|
| 3,855,553 A | * 12/1974 | Cronin | 331/117 R |
| 3,946,336 A | 3/1976 | Froom et al. | 331/107 R |
| 4,321,563 A | * 3/1982 | Lesartre | 331/117 FE |
| 4,491,969 A | 1/1985 | Datta | |
| 4,627,099 A | * 12/1986 | Shimakata | 455/76 |
| 4,990,865 A | * 2/1991 | Martheli | 331/99 |
| 5,097,228 A | * 3/1992 | McJunkin | 331/176 |
| 5,264,713 A | 11/1993 | Palmour | |
| 5,338,945 A | 8/1994 | Baliga et al. | |
| 5,434,542 A | * 7/1995 | Veith et al. | 331/99 |
| 5,483,679 A | * 1/1996 | Sasaki | 455/86 |
| 5,564,100 A | * 10/1996 | Huang et al. | 455/319 |
| 5,576,667 A | * 11/1996 | Goma | 331/117 D |
| 5,641,975 A | 6/1997 | Agarwal et al. | |
| 5,652,551 A | 7/1997 | Wittstruck | 331/107 R |
| 5,699,021 A | * 12/1997 | Hill | 331/56 |
| 5,774,788 A | 6/1998 | Hannah et al. | |
| 5,866,925 A | 2/1999 | Zolper et al. | |
| 5,923,058 A | 7/1999 | Agarwal et al. | |
| 6,028,850 A | * 2/2000 | Kang | 370/320 |
| 6,111,452 A | 8/2000 | Fazi et al. | |

OTHER PUBLICATIONS

Brian K. Kormanyos and Gabriel M. Rebeiz, Oscillator Design for Maximum Added Power, IEEE Microwave and Guided Wave Letters, Jun. 1994, pp. 205–207, vol. 4, No. 6.
J.B. Shealy, T. Jackson, A. Rachlin, M. Poulton, N. Bukhari, K. Ditzler, X. Gong, L. Sumpter, and D. Weeks, A 2 Watt Ku–Band Linear (Multi–Carrier) Transmit Module for VSAT Applications, IEEE MTT–S Digest, 1999, pp. 1055–1058.
Alekseev, Egor, and Pavlidis, Dimitris, "DC and High–Frequency Performance of AlGaN/GaN Heterojunction Bipolar Transistors," Solid–State Electronics, vol. 44, No. 2, pp. 245–252, Feb. 2000, XP004186194.

* cited by examiner

Primary Examiner—Vivian Chin
Assistant Examiner—Charles N. Appiah
(74) Attorney, Agent, or Firm—Withrow & Terranova, PLLC

(57) ABSTRACT

An oscillator and upconverters and downconverters including the oscillator are provided, wherein the oscillator includes a transistor comprised of a semiconductor material having a wide bandgap for producing RF output signals. For example, the transistor can be formed of a semiconductor material, such as GaN, AlGaN, SiC or BN, that has a bandgap of at least 2.0 eV. The oscillator also includes a bias supply for providing a supply voltage and a supply current. Additionally, the oscillator has a tank circuit that includes first and second reactances connected to respective terminals of the transistor such that the transistor is unstable and an oscillating RF output signal is produced. The tank circuit can also include a varactor connected to a respective reactance and a control input is provided to tune the oscillating RF output signal. Upconverters, both saturated and linear, and downconverters are also provided that include the oscillator.

41 Claims, 10 Drawing Sheets

OSCILLATOR HAVING A TRANSISTOR FORMED OF A WIDE BANDGAP SEMICONDUCTOR MATERIAL

FIELD OF THE INVENTION

The present invention relates generally to oscillators and, more particularly, to tunable oscillators having a transistor formed of a wide bandgap semiconductor material.

BACKGROUND OF THE INVENTION

Upconverters and downconverters that include an oscillator, such as a voltage controlled oscillator, a phase locked oscillator or the like, are widely utilized for a variety of applications including signal transmission, signal reception and the like. With respect to commercial applications, upconverters and downconverters are utilized in broadband terrestrial and satellite communication systems, broadcast systems, radar systems and the like. For example, wireless radio systems include an upconverter for upconverting a low frequency baseband signal to a higher frequency for transmission purposes. Likewise, in military applications, upconverters are utilized not only as transmitters, but also as radar jamming devices and the like.

There are two principle types of upconverters for radio frequency (RF) systems, saturated upconverters and linear upconverters. As shown in FIG. 1, a saturated upconverter typically includes a phase locked oscillator 12 that receives a reference signal having a relatively low frequency and that produces an output signal having a higher frequency. As known to those skilled in the art and as depicted in FIG. 2, a phase locked oscillator typically includes a phase detector/discriminator 12a that compares the relative phases of a relatively low frequency reference signal and a feedback signal derived from the output of the phase locked oscillator. The output of the phase detector/discriminator is amplified by a loop amplifier 12b, filtered by a loop filter 12c and provided to a voltage controlled oscillator 12d in order to controllably adjust the output of the voltage controlled oscillator. In particular, the amplified and filtered signal is utilized to controllably alter the bias voltage applied to the transistor of the voltage controlled oscillator. The phase locked oscillator can also include an optional prescalar/divider 12e that modifies the output of the phase locked oscillator that is fed back to the phase detector/discriminator. As such, the phase locked oscillator forms a phase locked loop.

A saturated upconverter 10 also generally includes one or more drivers 14, one or more amplifiers 16 and a solid state power amplifier 18 for substantially amplifying the output signal provided by the phase locked oscillator 12. Although not depicted, the saturated upconverter can also include a frequency doubling element or the like for altering the frequency of the output signal. Once appropriately amplified, the output signal is provided to an antenna 20 for transmission.

As depicted in FIG. 3, a linear upconverter 22 also generally includes a phase locked oscillator 24, such as depicted in FIG. 2, for receiving a relatively low frequency reference signal and for producing an output signal having a greater frequency. A conventional linear upconverter also includes a first mixer 26 for combining an input signal having an intermediate frequency and a signal derived from the output signal of the phase locked oscillator. In this regard, the linear upconverter can include a frequency divider 28 disposed between the phase locked oscillator and the first mixer for reducing the frequency of the output signal of the phase locked oscillator. In addition, the linear upconverter can include one or more drivers 29 between the frequency divider and the first mixer in order to amplify the output of the frequency divider. Thus, the output signal of the phase locked oscillator, following its reduction in frequency and its amplification, serves as a local oscillator signal for the first mixer. The linear upconverter also includes a second mixer 30 for combining the output of the first mixer and another signal derived from the output signal of the phase locked oscillator. As depicted, the linear upconverter typically includes at least one and, more commonly, a plurality of drivers 32 and/or amplifiers between the phase locked oscillator and the second mixer in order to appropriately amplify the output signal of the phase locked oscillator. Although not depicted in FIG. 2, some linear upconverters include a frequency multiplier or the like between the phase locked oscillator and the second mixer for increasing the frequency of the output signal produced by the phase locked oscillator prior to its presentation to the second mixer. In any event, the signal derived from the output signal produced by the phase locked oscillator serves as a local oscillator signal for the second mixer. The linear upconverter can further include a solid state power amplifier 34 for amplifying the output of the second mixer prior to transmission by an antenna 36 or the like. Further, the linear upconverter can include filters, such as a first filter 38 disposed between the first and second mixers and a second filter 40 disposed between the second mixer and the solid state power amplifier, for blocking the respective local oscillator signals.

Both types of upconverters are effective for reliably producing RF signals of a predetermined frequency and power level. However, these upconverters are not as efficient as desired. For example, some upconverters produce RF output signals that have only about ten percent of the DC power that was input to the signal source. The relative inefficiency of conventional upconverters is attributable to a number of factors. However, one of the more prominent factors for this inefficiency is the DC power required to bias the plurality of components of the upconverter in order for the components to function as desired. In a saturated upconverter 10, for example, the phase locked oscillator 12, as well as each driver 14, each amplifier 16 and the solid state power amplifier 18 must be appropriately biased by means of a supply voltage and a supply current in order to produce the desired RF output signal. Similarly, in a linear upconverter 22, the phase locked oscillator 24, each driver 32 and the solid state power amplifier 40 must be appropriately biased by means of a supply voltage and a supply current in order to produce the desired RF output signal. As such, significant input power is consumed to appropriately bias each of these components, thereby substantially diminishing the efficiency with which these conventional upconverters operate.

Additionally, each component of a conventional upconverter occupies a certain amount of space. As such, upconverters that include a plurality of components, such as a plurality of drivers or amplifiers, will generally be somewhat larger. With increasing emphasis being placed upon the miniaturization of all electrical devices, including upconverters, the space requirements of each additional component of a upconverter disadvantageously limit the extent to which the size of a conventional upconverter can be reduced. Similarly, the bias circuitry required for each of these components requires some additional space, thereby further limiting the extent to which the size of a conventional upconverter can be reduced.

Although the drivers and amplifiers of a conventional upconverter decrease the efficiency of the upconverter and increase the space requirements of the signal source, conventional upconverters require drivers and amplifiers in order to appropriately amplify the signals provided by the oscillator prior to transmission. In this regard, the oscillators utilized by conventional upconverters are formed of traditional semiconductor materials having a relatively small bandgap, such as a bandgap of less than two electron volts (eV). For example, the oscillators of conventional upconverters are generally formed of silicon (Si), gallium arsenide (GaAs) or indium phosphide (InP) which have bandgaps of 1.1 eV, 1.43 eV and 1.34 eV, respectively. Transistors formed of these material systems can be readily fabricated and can offer extremely predictable performance. However, the oscillators that include transistors formed of these traditional semiconductor materials can not generally be fabricated in a cost-effective manner so as to produce signals having the power required for transmission. As such, the signals produced by the oscillators of conventional upconverters must generally be amplified, oftentimes repeatedly, prior to transmission. While each amplification stage increases the signal strength, the efficiency with which the output signal is produced is correspondingly decreased as described above.

Accordingly, while several types of conventional upconverters exist, a need persists for upconverters, both saturated and linear, to produce output signals of a desired power level and frequency in a more efficient manner. Additionally, it would be desirable for upconverters, both saturated and linear, to be designed in such a manner that the upconverters require less space and can therefore be more compactly packaged. Moreover, it would be desirable to provide upconverters, both saturated and linear, that required fewer components and less bias circuitry, thereby simplifying the design of the upconverters.

As depicted in FIG. 4, a downconverter 21, such as commonly utilized in signal reception applications, also includes an oscillator 23, such as a phase locked oscillator or a dielectric resonator oscillator. Although not illustrated, the phase locked oscillator would receive a reference signal, such as from a crystal oscillator or the like. The downconverter also includes a mixer 25 that mixes the received signal provided by an antenna 27 with the output of the oscillator. As shown, the downconverter also includes one or more low noise amplifiers 29 for amplifying the signals received by the antenna and one or more drivers and/or amplifiers 31 for amplifying the signals provided by the oscillator. The output of the mixer is then filtered by filter 33 and amplified by amplifier 35. As described above in conjunction with upconverters, the efficiency of the signal reception process is adversely impacted by the need to bias the various components, such as the drivers and/or amplifiers that amplify the signals provided by the oscillator. Moreover, complexity of the design of a downconverter and the space required by a downconverter is disadvantageously increased by each of the components that are required to appropriately process the signals as well as the attendant bias circuitry. As such, a need also persists for downconverters to produce output signals in a more efficient manner. Additionally, it would be desirable for downconverters to be designed in such a simpler manner that required less space and could therefore be more compactly packaged.

SUMMARY OF THE INVENTION

An oscillator and upconverters and downconverters including the oscillator are provided, wherein the oscillator includes a transistor comprised of a semiconductor material having a wide bandgap of at least 2.0 eV for producing radio frequency (RF) output signals. Since the transistor is comprised of a semiconductor material having a wide bandgap, the resulting RF output signals can have much greater power than the output signals provided by conventional oscillators that include transistors formed of traditional semiconductor materials with relatively small bandgaps. The higher power is due to the larger voltage and current operation of wide bandgap transistors. The larger voltage operation is due to the higher breakdown field of wide band gap materials (approximately $2 \times 10^6$ V/cm) compared with that of relatively small band gaps (approximately $5 \times 10^5$ V/com). Thus, the oscillator as well as the upconverters and downconverters including the oscillator need not include the plurality of drivers, amplifiers or the like, nor any of the associated bias circuitry otherwise required by conventional upconverters and downconverters. The oscillator and the upconverters and downconverters including the oscillator can therefore produce output signals in a much more efficient manner than conventional upconverters and downconverters. In addition, upconverters and downconverters including the oscillator of the present invention generally have fewer components than traditional upconverters and downconverters and correspondingly require less space and can be packaged more compactly than the traditional upconverters and downconverters.

As mentioned above, an oscillator of the present invention includes a transistor comprised of a semiconductor material having a wide bandgap for producing an RF output signal. Preferably, the transistor is comprised of a semiconductor material, such as gallium nitride (GaN), aluminum gallium nitride (AlGaN), silicon carbide (SiC) or boron nitride (BN), that has a bandgap of at least 2.0 electron volts (eV). Additionally, the transistor is preferably either a field effect transistor, a heterojunction bipolar transistor or a high electron mobility transistor.

In addition to the wide bandgap transistor, the oscillator includes a bias supply for providing a supply voltage and a supply current to the transistor. Additionally, the oscillator includes a tank circuit in electrical communication with the transistor for causing the transistor to produce an RF output signal once the transistor is provided with the supply voltage and the supply current. In this regard, the transistor includes first, second and third terminals and the tank circuit includes first and second reactances electrically connected to the first and second terminals of the transistor, respectively. As such, the tank circuit causes the transistor to be unstable, thereby producing an RF output signal. The tank circuit can also include a varactor electrically connected to a respective reactance. A control input is advantageously provided between the varactor and the respective reactance in order to tune the RF output signal.

According to one aspect of the present invention, a saturated upconverter is provided that includes an oscillator including a transistor formed of a wide bandgap semiconductor material that operates in saturation to produce an RF output signal in response to a supply voltage and a supply current. The saturated upconverter of this aspect of the present invention can also include an antenna in electrical communication with the oscillator for transmitting the RF output signal. As a result of the relatively high power of the RF output signal provider by the oscillator of the present invention, the antenna can transmit the RF output signal without requiring any additional amplification stages between the oscillator and the antenna. In order to provide isolation, the saturated upconverter can also include a switching element, such as a solid state power amplifier, disposed between the oscillator and the antenna.

According to another aspect of the present invention, a linear upconverter is provided that includes an oscillator including a transistor formed of a wide bandgap semiconductor material operating in a linear mode for producing an RF signal in response to a supply voltage and a supply current. The linear upconverter also includes a first mixer for mixing a signal having an intermediate frequency with a signal derived from the RF signal to produce a first signal. The linear upconverter also includes a second mixer for mixing the first signal produced by the first mixer with another signal derived from the RF signal to produce an output signal. As a result of the relatively high power of the RF signal provided by the oscillator of the present invention, the first and second mixers of the linear upconverter of this aspect of the present invention can receive the respective signals derived from the RF signal without requiring any additional amplification of the RF signal between the oscillator and the first and second mixers.

The linear upconverter of this aspect of the present invention can include other components, if so desired. In this regard, the linear upconverter can include a frequency alteration element disposed between the oscillator and a respective mixer for altering the frequency of the RF signal that is produced by the oscillator and provided to the respective mixer. The linear upconverter can also include an antenna for transmitting the output signal produced by the second mixer. Further, the linear upconverter can include a switching element disposed between the second mixer and the antenna to provide isolation. The linear upconverter can additionally include a first filter disposed between the first and second mixers and a second filter disposed between the second mixer and the antenna, both of which remove the signals derived from the RF signal.

According to another aspect of the present invention, a downconverter is provided that includes an oscillator having a transistor formed of a semiconductor material having a wide bandgap for producing RF signals in response to a supply voltage and a supply current. The downconverter also includes an antenna for receiving signals and a mixer for mixing the signals received by the antenna with signals derived from the RF signals. According to the present invention, however, the mixer receives the signals derived from the RF signals without requiring any additional amplification of the RF signals between the oscillator and the mixer. The downconverter of the present invention can also include one or more amplifiers between the antenna and the mixer to amplify the signals received by the antenna, if desired.

Therefore, upconverters, both saturated and linear, and downconverters are provided that can produce RF output signals of a desired frequency and power level in a more efficient manner. In this regard, the upconverters include an oscillator that has a transistor formed of a wide bandgap semiconductor material in order to produce an RF signal having a relatively high power. The upconverters therefore need not amplify the RF signals provided by the oscillator, thereby permitting many, if not all, of the drivers and amplifiers required by conventional upconverters to be eliminated. Thus, the upconverters of the present invention need not separately bias a plurality of drivers and amplifiers and can accordingly produce an RF output signal in a more efficient manner. Moreover, the upconverters of the present invention generally include fewer components and require less bias circuitry than conventional upconverters, thereby reducing the space requirements of the upconverters and permitting the upconverters to be packaged in a more compact manner.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 5A:
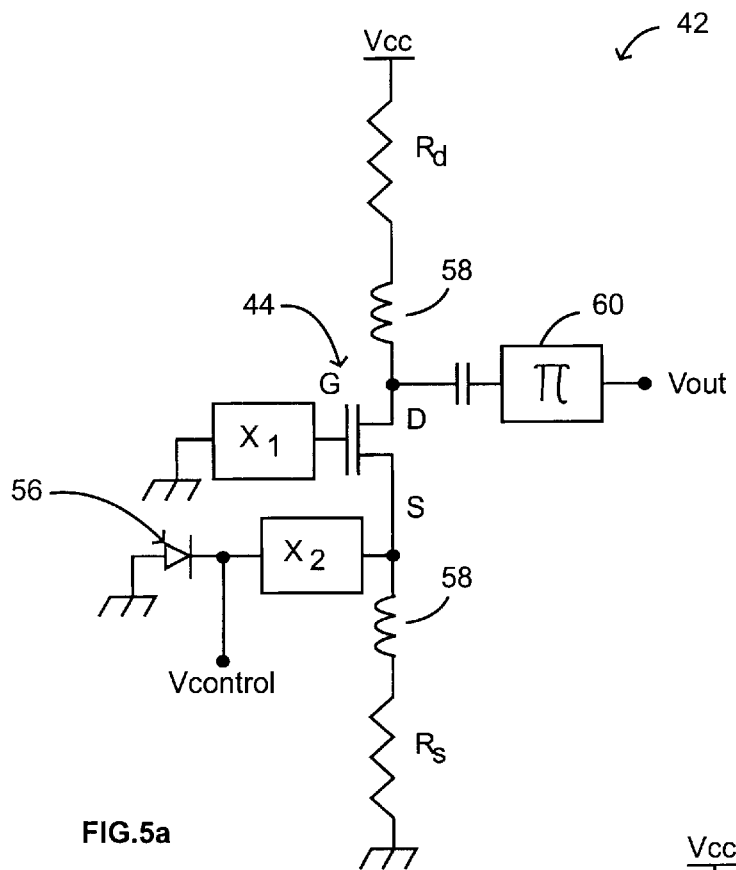
FIGS. 5a and 5b are alternative embodiments of an oscillator of the present invention.
Figure 5B:
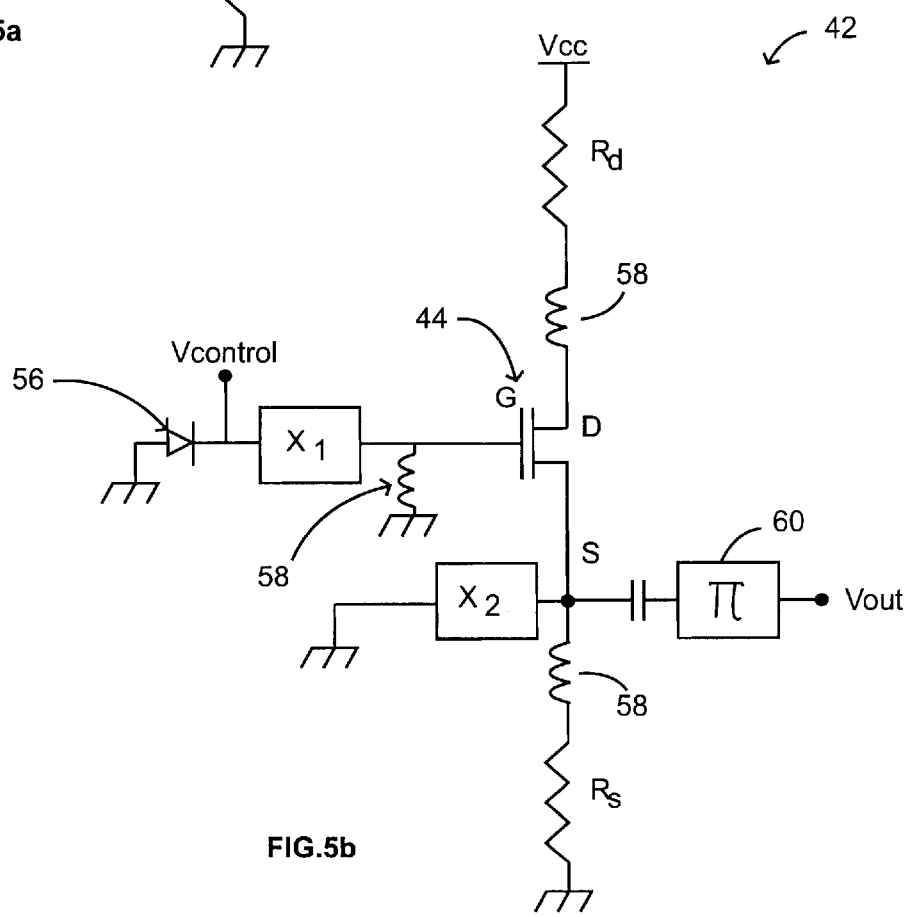

According to the present invention, an oscillator, such as a voltage controlled oscillator, is provided that is capable of providing radio frequency (RF) output signals, typically in the microwave range, that have a relatively high power level. Phase locked oscillators can include the voltage controlled oscillators of the present invention and the phase locked oscillators can, in turn, be incorporated into upconverters, including both saturated and linear upconverters, in order to produce RF output signals of a desired frequency in a highly efficient manner. Similarly, phase locked oscillators or dielectric resonator oscillators that include the oscillators of the present invention can be incorporated in downconverters for signal reception applications. Referring now to FIGS. 5a and 5b, two advantageous embodiments of an oscillator 42 of the present invention are depicted. As described below, however, the oscillator of the present invention can be configured in a variety of other manners without departing from the spirit and scope of the present invention.

Regardless of the configuration,;the oscillator 42 of the present invention includes a transistor 44 formed of a semiconductor material having a wide bandgap. For example, the transistor can be formed of gallium nitride (GaN) having a bandgap of about 3.4 electron volts (eV). Alternatively, the transistor can be formed of silicon carbide (SiC) having a bandgap of between about 2.3 eV and 3.2 eV, or of a combination of aluminum gallium nitride (AlGaN) and GaN with the AlGaN having a bandgap of about 4.0 eV in instances in which the aluminum content is 30%. Accordingly, the oscillator of the present invention includes a transistor formed of a semiconductor material that preferably has a bandgap of at least 2.0 eV and, more preferably, at least 3 eV. In addition to the semiconductor materials mentioned above, the oscillator can include a transistor formed of other semiconductor materials if the other semiconductor materials have a sufficiently wide bandgap, such as boron nitride (BN) or the like. As a result of the wide bandgap and the associated high voltage operation, the RF output signals emitted by the oscillator have a relatively high power level, thereby simplifying the design of upconverters and downconverters that incorporate the oscillator of the present invention as described below.

Figure 6:
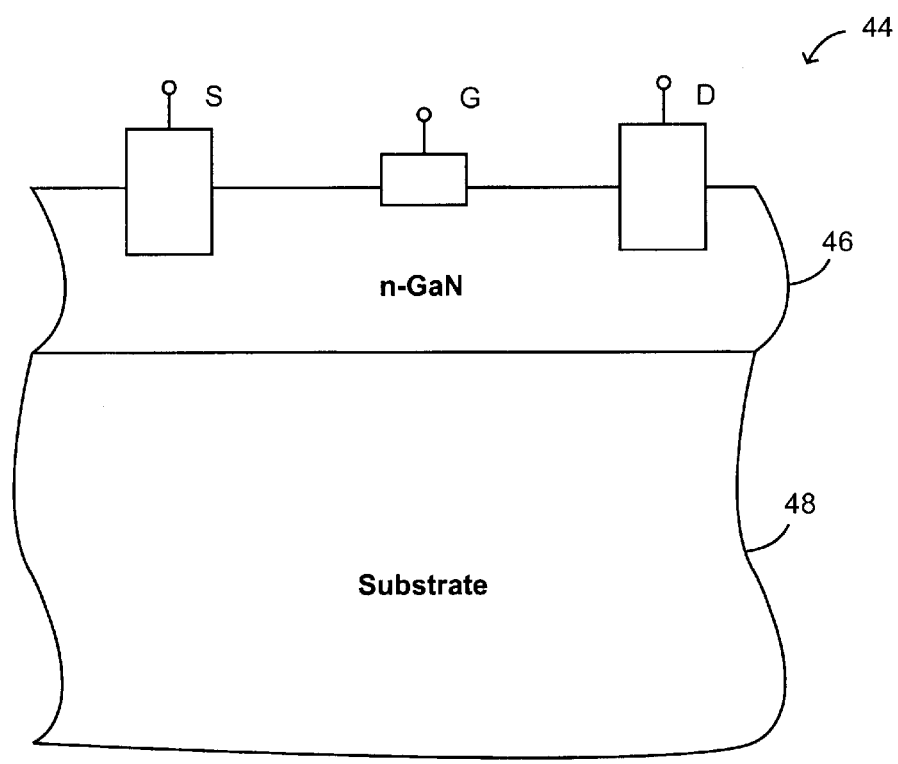
FIG. 6 is a cross-sectional view of a field effect transistor formed of n-type doped gallium nitride (GaN), although the transistor could also be formed of n-type doped silicon carbide (SiC) or n-type. doped boron nitride (BN).

Regardless of the semiconductor materials from which the transistor 44 is formed, the transistor has three terminals, namely, first, second and third terminals. In the illustrated embodiment, the transistor is ia field effect transistor having drain (D), gate (G) and source (S) terminals. The field effect transistor can be fabricated from a variety of semiconductor materials having a wide bandgap as described above. For example, the field effect transistor can be formed of GaN. Alternatively, the field effect transistor can be formed of SiC or BN. As known to those skilled in the art and as depicted in FIG. 6, a metal-semiconductor field effect transistor (MESFET) includes an appropriately doped layer 46 of GaN, such as a layer of n-dodped GaN, formed upon a substrate 48, also typically formed of GaN. The GaN MESFET also includes drain (D), gate (G) and source (S) terminals formed of a metal, such as nickel/gold for the gate terminal and titanium/aluminum/gold for the source and drain terminals, with the gate terminal disposed between the drain and source terminals. As shown in FIG. 6, the drain and source terminals are formed so as to penetrate further into the layer of appropriately doped GaN than the gate terminal. Similar transistors can be fabricated from n-doped SiC and n-doped BN, if so desired. Further details regarding field effect transistors formed of GaN or SiC are provided by R. J. Trew, *Wide Bandgap Semiconductor Transistors for Microwave Power Amplifiers,* IEEE Microwave Magazine, pp. 45–54 (March 2000), the contents of which are incorporated herein by reference.

Figure 7:
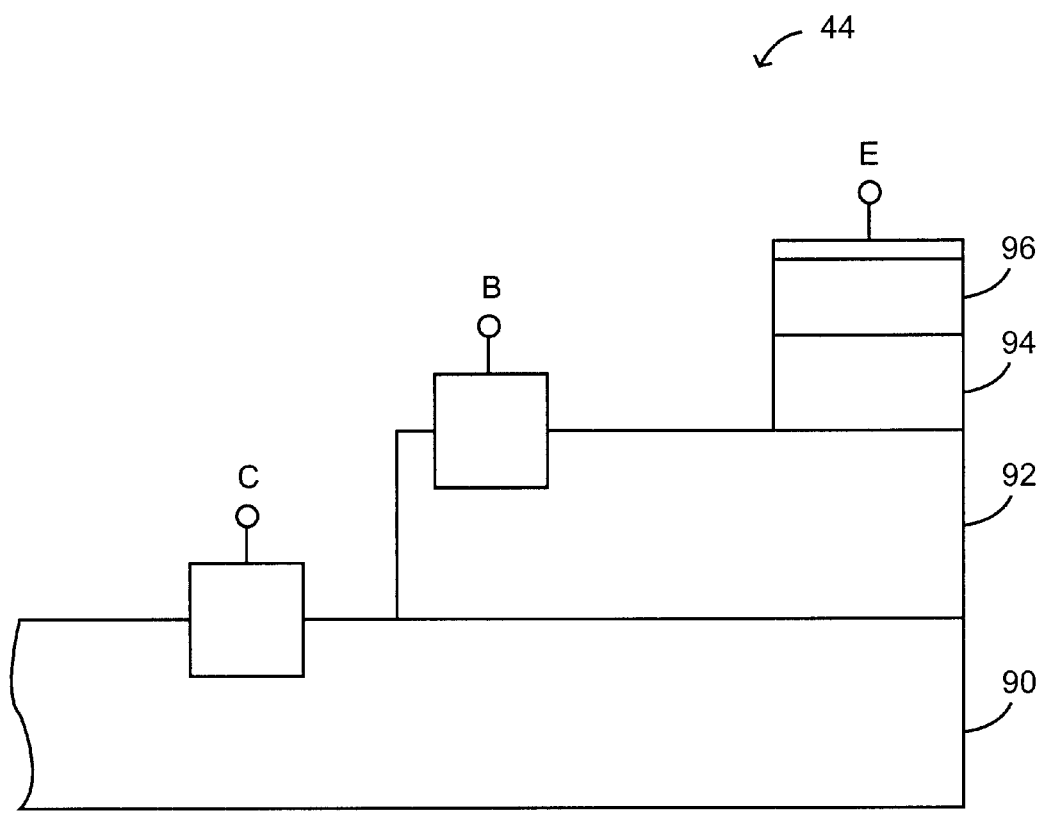
FIG. 7 is a cross-sectional view of a heterojunction bipolar transistor formed of aluminum gallium nitride (AlGaN) and gallium nitride (GaN).

The oscillator 42 can include other types of transistors 44 so long as the other transistors are also formed of a semiconductor material having a wide bandgap as described above. For example, the oscillator of an alternative embodiment can include a bipolar transistor and, more preferably, a heterojunction bipolar transistor (HBT). In this regard, one exemplary type of heterojunction bipolar transistor is formed of AlGaN and GaN and is depicted in FIG. 7 as will be described in more detail hereinafter. However, the oscillator of the present invention can include an heterojunction bipolar transistor formed of other semiconductor materials having a wide bandgap if so desired. As depicted in FIG. 7, for example, a heterojunction bipolar transistor formed of AlGaN and GaN includes a first layer 90 of n-doped GaN, a second layer 92 of p-doped GaN or p-doped InGaN, a third layer 94 of n-doped AlGaN and a fourth layer 96 of n$^+$-doped GaN. Metallic contacts are then formed: on the first, second and fourth layers to define the collector (C), base (B) and emitter (E) terminals, respectively.

Figure 8:
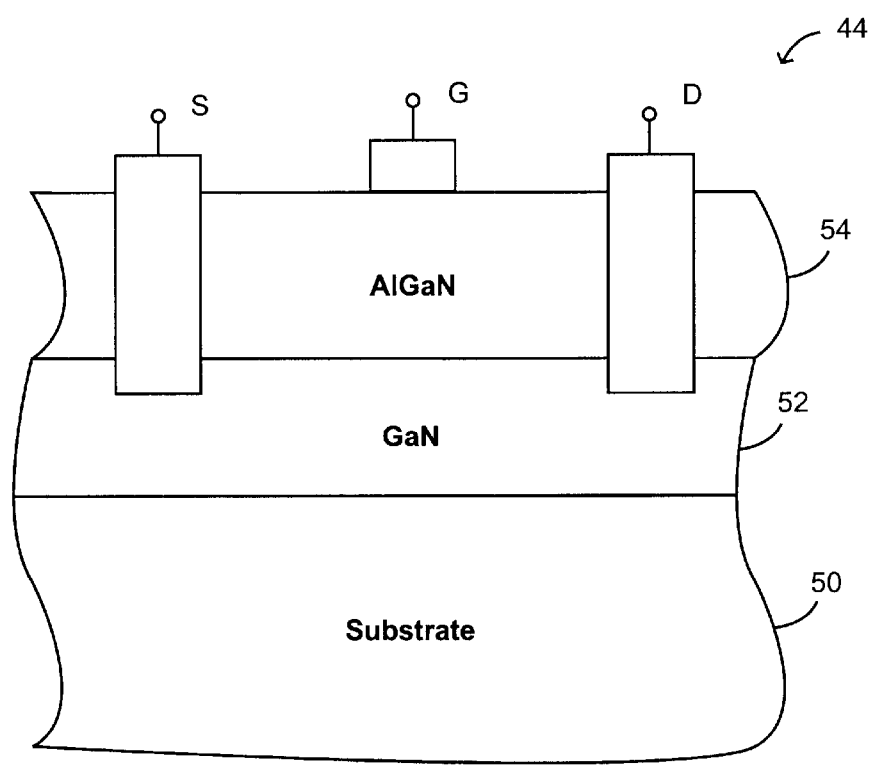
FIG. 8 is a cross-sectional view of a high electron mobility transistor formed of aluminum gallium nitride (AlGaN) and gallium nitride (GaN).

Additionally, the oscillator can include a high electron mobility transistor (HEMT) as depicted in FIG. 8. In this embodiment, the HEMT includes a semi-insulating substrate 50, typically formed of SiC, sapphire or GaN. A GaN layer 52 is then deposited upon the substrate and a layer 54 of AlGaN is thereafter deposited upon the GaN layer. Drain (D) and source (S) terminals are then defined by metallic regions that extend through the AlGaN layer and partially into the GaN layer. Additionally, a gate terminal (G) is defined by another metallic region that is disposed upon the AlGaN layer between the source and drain terminals. Although not necessary for the practice of the present invention, the AlGaN layer can be doped with donor impurities, such as silicon (Si). However, the polarization effect is believed to provide sufficient free charge in the channel defined within the GaN layer proximate the AlGaN layer and extending between the source and drain terminals, even without doping the AlGaN layer with donor impurities.

Figure 9:
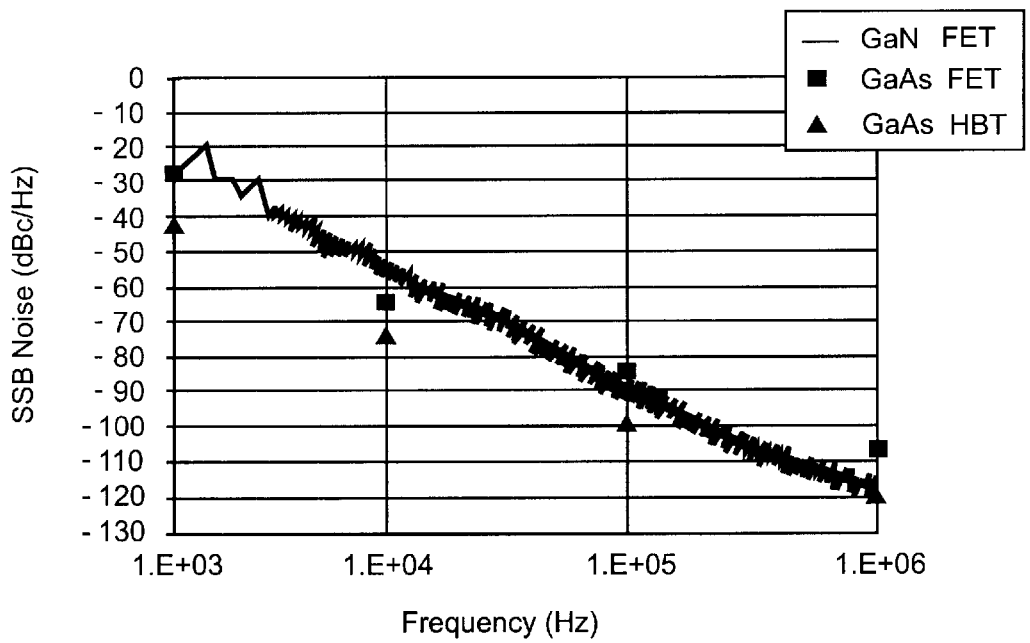
FIG. 9 is a graphical representation of the phase noise of an oscillator of one embodiment of the present invention that is operating at about 6 GHz and that includes a transistor formed of gallium nitride (GaN) in comparison to the phase noise of a gallium arsenide (GaAs) based field effect transistor and a GaAs based heterojunction bipolar transistor.

The oscillator 42 of the present invention can include transistors 44 formed of other semiconductor materials having a wide bandgap in addition to the field effect transistor formed of GaN and the heterojunction bipolar transistor and the high electron mobility transistor formed of AlGaN and GaN. However, the voltage controlled oscillator of one advantageous embodiment includes the field effect transistor formed of GaN since the 1/f noise characteristics of the GaN field effect transistor are comparable to the 1/f noise characteristics of both a field effect transistor formed of gallium arsenide (GaAs) and a heterojunction bipolar transistor formed of GaAs, two conventional transistors formed of a semiconductor material, i.e., GaAs, having a relatively low bandgap, such as about 1.1 eV. In this regard, FIG. 9 depicts the single sideband noise in dBc/Hz of the oscillator of FIG. 5a that includes a GaN field effect transistor operating at about 6 GHz in comparisons to the single sideband noise of both a GaAs field effect transistor and a GaAs heterojunction bipolar transistor operating at about 6

Ghz. More particularly, the single sideband noise of each transistor is plotted for a range of frequencies offset from the operating frequency of 6 GHz by between $1 \times 10^3$ Hz and to $1 \times 10^6$ Hz as depicted along the horizontal axis of FIG. 9. Accordingly, even though a GaN field effect transistor produces RF output signals having much greater power levels, such as about 100 times greater, than the RF output signals produced by conventional GaAs field effect transistors or GaAs heterojunction bipolar transistors as described below, the phase noise of a GaN field effect transistor is approximately equivalent to the phase noise of a conventional GaAs field effect transistors or a GaAs heterojunction bipolar transistors as depicted in FIG. 9.

In addition to the transistor 44 formed of a semiconductor material having a wide bandgap, the oscillator 42 of the present invention includes a bias supply and a tank circuit. The bias supply provides a supply voltage Vcc and a supply current Icc to the transistor. In the embodiments depicted in FIGS. 5a and 5b, a single bias supply, designated Vcc, is provided. However, the bias supply can be a double bias supply in order to provide both +Vcc and −Vcc. In the embodiment in which a single bias supply is utilized to provide the supply voltage Vcc and supply current Icc to a field effect transistor as depicted in FIGS. 5a and 5b, the oscillator also includes a source resistor $R_s$ that determines the bias of the transistor. In this regard, the source resistor $R_s$ determines the supply current Icc which, in turn, determines the voltage level of the source terminal. Even though the oscillator of this embodiment requires the source resistor $R_s$ in order to be appropriately biased, the source resistor $R_s$ should be as small as possible since the source resistor $R_s$ degrades the efficiency of the voltage control oscillator. In this regard, the efficiency of the oscillator is typically defined as the ratio of the output power to the input power. The input power is in turn defined by the product of Vcc and Icc. As the resistance of the source resistor $R_s$ is increased in order to decrease the supply current, the output power will also be disadvantageously limited, thereby actually serving to decrease the efficiency of the oscillator. In order to maximize the efficiency, the transistor also preferably has a small threshold voltage. As depicted in FIGS. 5a and 5b, the oscillator can optionally also include a drain resistor $R_d$ for bias purposes, such as in instances in which the supply voltage is 30 volts and the transistor is designed to accommodate 20 volts. As described above in conjunction with the source resistor $R_s$, it is desirable to minimize the resistance of the drain resistor $R_d$ since the drain resistor similarly decreases the overall efficiency of the oscillator.

The tank circuit is electrically connected to the transistor 44 so as to cause the transistor to be unstable and to thereby produce an oscillating RF output signal once the transistor is provided with the supply voltage Vcc and the supply current Icc. In the illustrated embodiments, the tank circuit includes a first reactance $X_1$ and a second reactance $X_2$ connected to the gate (G) and source (S) terminals, respectively. However, the tank circuit can have other configurations, such as by including only a single reactance connected to one of the gate and source terminals, without departing from the spirit and scope of the present invention. In the illustrated embodiment in which the transistor is a field effect transistor, the first and second reactances combine with the intrinsic capacities of the transistor Cgs to define the nominal oscillation frequency of the transistor. As known to those skilled in the art, however, the nominal oscillation frequency of other types of transistors are determined in other manners. For example, a hetrojunction bipolar transistor has a nominal oscillation frequency defined by the combination of the first and second reactances connected to the base and emitter terminals, respectively, and the intrinsic base-emitter capacitance Cbe. As such, the nominal oscillation frequency of the transistor of the oscillator 42 of the present invention can be determined by appropriate selection of the first and second reactances.

In order to permit the oscillation frequency of the transistor 44 and, in turn, the frequency of the RF output signals produced by the oscillator 42 of the present invention to be tuned, the tank circuit can also include a varactor 56. The varactor is electrically connected to a respective reactance such as the second reactance $X_2$ in the embodiment of FIG. 5a and the first reactance $X_1$ in the embodiment of FIG. 5b. A control input $V_{control}$ is therefor defined between the varactor and the respective reactance such that the oscillation frequency of the transistor can be varied in order to tune the oscillating RF output signal by providing different control voltages at the control input. Typically, there is a tradeoff or a compromise between the tuning range of the transistor and the single sideband noise with oscillators having larger tuning ranges generally having higher phase noise and, conversely, oscillators having smaller tuning ranges generally having lower phase noises.

Figure 2:
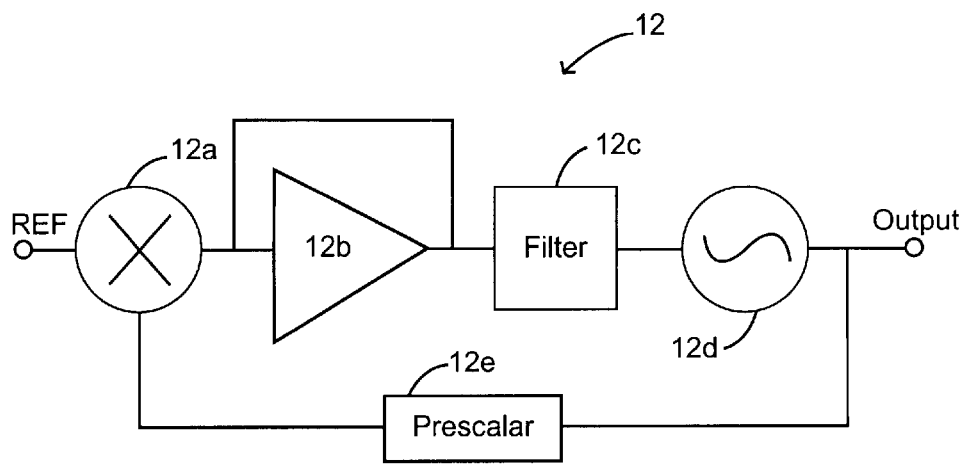
FIG. 2 is a schematic representation of a phase locked oscillator.
Figure 4:
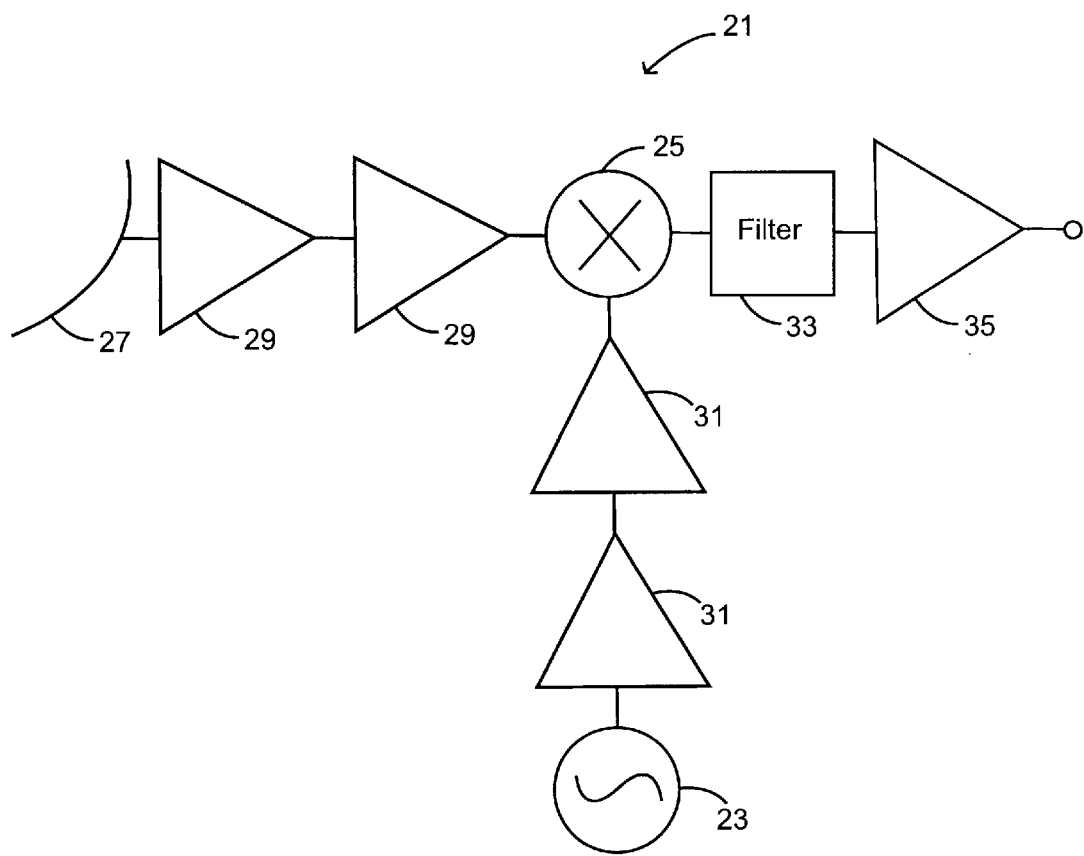
FIG. 4 is a schematic representation of a conventional downconverter.

In those embodiments in which the voltage controlled oscillator 42 of the present, such as depicted in FIGS. 5a and 5b, in incorporated in a phase locked oscillator 12 as shown in FIG. 2, the output of the loop filter 12c is typically utilized as the control input $V_{control}$ in order to controllably vary the oscillation frequency of the ouput of the voltage controlled oscillator. As such, the output of the voltage controlled oscillator will effectively track the reference input. However the control input $V_{control}$ can be provided in other manners without departing from the spirit and scope of the present invention.

As depicted in FIGS. 5a and 5b, the oscillator 42 can also include choke elements 58, such as inductors, to prevent the bias circuitry from consuming RF power from the transistor 44. As such, choke elements can be electrically connected to the drain (D) and source (S) terminals and, in the embodiment depicted in FIG. 5b, the gate (G) terminal as well. With respect to the choke element connected to the gate terminal, the choke element provides a DC path to ground which serves to establish Vgs which is defined as the gate voltage (tied to ground through the choke element) minus the source voltage (the product of Icc and $R_s$).

The modulation sensitivity $K_v$ of an oscillator 42 can be determined for a range of frequencies by determining the change in frequency $\Delta f$ attributable to a change in the control input $\Delta V_{control}$. As such, $K_v$ can be defined to equal $\Delta f/\Delta V_{control}$. For purposes of example, a voltage controlled oscillator including a HEMT 44 formed of AlGaN and GaN having a sheet carrier concentration that is greater than $10^{13}$ electrons/cm² and further including $R_s$=5 ohms, $R_d$=2 ohms, choke elements equal to 90° at 6 GHz, $X_1$ equal to transmission line to ground, $X_2$ equal to transmission line with blocking capacitor and Vcc=30 volts, is designed to have a nominal oscillation frequency of 6 GHz. By changing the control input $V_{control}$, the frequency of the RF output signal also varies about 6 GHz as listed below in Table 1 and graphically depicted in FIG. 10.

TABLE 1

| $V_{control}$(Volts) | Freq (MHz) |
|---|---|
| 3.7 | 5737 |
| 3.9 | 5772 |

TABLE 1-continued

| $V_{control}$(Volts) | Freq (MHz) |
|---|---|
| 4.1 | 5804 |
| 4.3 | 5839 |
| 4.5 | 5871 |
| 4.7 | 5898 |
| 4.9 | 5927 |
| 5.1 | 5947 |
| 5.3 | 5970 |
| 5.5 | 5991 |
| 5.7 | 6008 |
| 5.9 | 6022 |
| 6.1 | 6035 |
| 6.3 | 6046 |
| 6.5 | 6057 |
| 6.7 | 6066 |
| 6.9 | 6077 |
| 7.1 | 6091 |
| 7.3 | 6104 |
| 7.5 | 6114 |
| 7.7 | 6121 |
| 7.9 | 6128 |
| 8.1 | 6134 |
| 8.3 | 6141 |
| 8.5 | 6154 |
| 8.7 | 6163 |
| 8.9 | 6171 |
| 9.1 | 6181 |
| 9.3 | 6191 |
| 9.5 | 6200 |
| 9.7 | 6209 |
| 9.9 | 6217 |
| 10.1 | 6222 |
| 10.3 | 6228 |
| 10.5 | 6234 |
| 10.7 | 6244 |
| 10.9 | 6254 |
| 11.1 | 6261 |
| 11.3 | 6268 |
| 11.5 | 6274 |
| 11.7 | 6281 |
| 11.9 | 6288 |
| 12.1 | 6294 |
| 12.3 | 6301 |
| 12.5 | 6308 |
| 12.7 | 6314 |
| 12.9 | 6319 |
| 13.1 | 6324 |
| 13.3 | 6328 |
| 13.5 | 6334 |
| 13.7 | 6337 |
| 13.9 | 6341 |
| 14.1 | 6348 |

Figure 11:
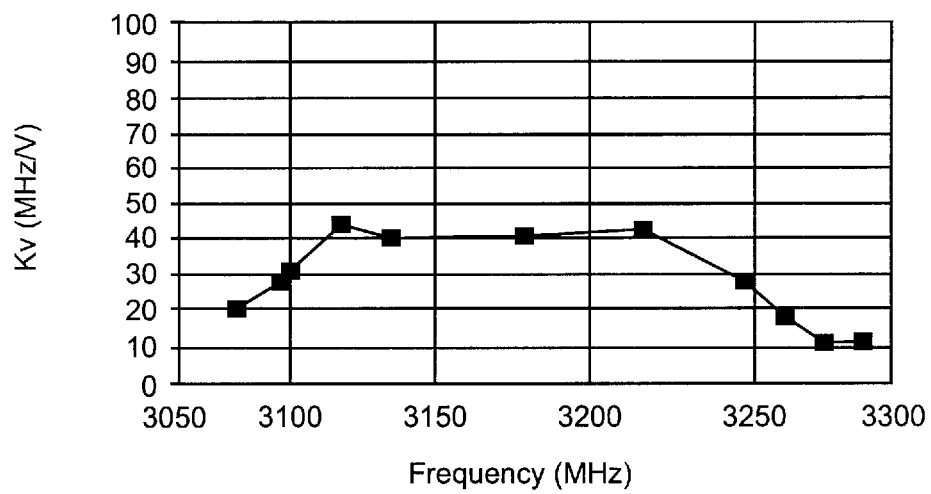
FIG. 11 is a graphical representation of the modulation sensitivity of an oscillator of another embodiment of the present invention that includes a transistor formed of AlGaN and GaN and that is operating at about 3 GHz.

Likewise, the modulation sensitivity of another oscillator 42 having a HEMT 44 formed of AlGan and GaN and associated components as described above can be determined in instances in which the oscillator is designed to have a nominal oscillation frequency of 3 GHz. By changing the control input $V_{control}$, the frequency of the RF output signal also varies about 3 GHz as listed below in Table 2 and graphically depicted in FIG. 11.

TABLE 2

| $V_{control}$ (Volts) | Freq. (MHz) |
|---|---|
| 0.4 | 3080 |
| 1 | 3097 |
| 1.1 | 3100 |
| 1.5 | 3117 |
| 2 | 3137 |
| 3 | 3177 |

TABLE 2-continued

| $V_{control}$ (Volts) | Freq. (MHz) |
|---|---|
| 4 | 3219 |
| 5 | 3247 |
| 6 | 3263 |
| 7 | 3274 |
| 8 | 3285 |

Figure 10:
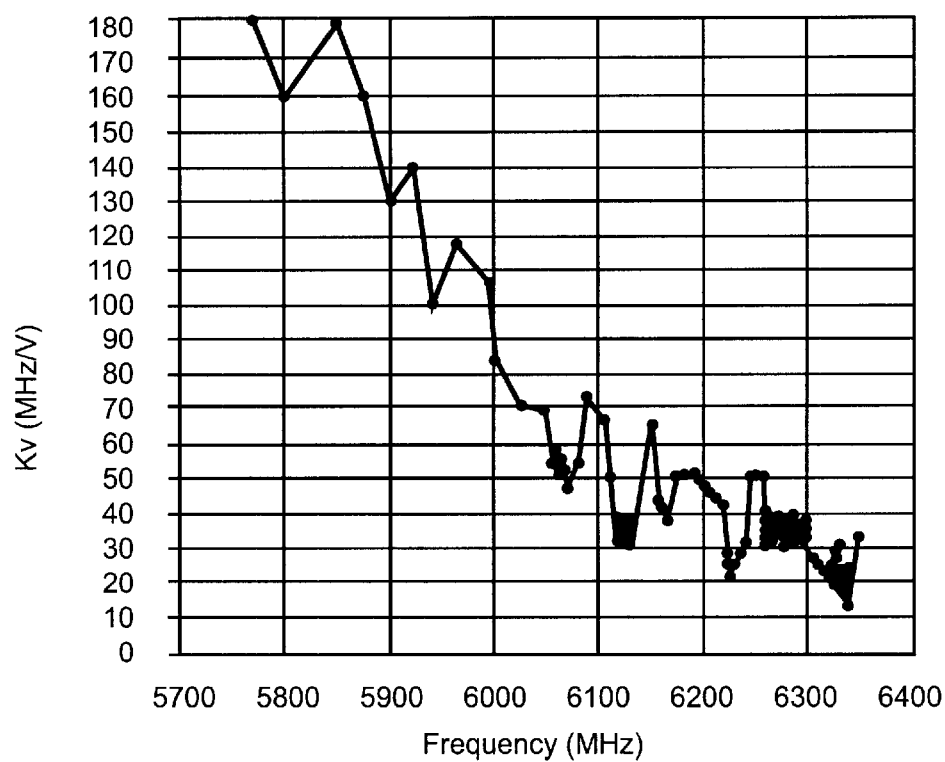
FIG. 10 is a graphical representation of the modulation sensitivity of an oscillator of one embodiment of the present invention that includes a transistor formed of AlGaN and GaN and that is operating at about 6 GHz.

As depicted, variations in the control input effectively alter the frequency of the RF output signal. In addition, each embodiment of the oscillator 42, namely, the embodiment designed to oscillate at 6 GHz and the embodiment designed to oscillate at 3 GHz, has a range of frequencies over which the modulation sensitivity $K_v$ remains approximately constant. The adjustment of the frequency of the RF output signal is therefore simplified in these regions since the frequency will change by approximately the same amount in response to changes of about the same magnitude in the control input. As shown in FIG. 10, for example, the oscillator that is designed to have a nominal oscillation frequency of 6 GHz has a relatively constant $K_v$ for frequencies above about 6050 MHz, i.e., above 6.05 Ghz. Likewise, the oscillator that is designed to have a nominal oscillation frequency of 3 MHz has a range of frequencies between about 3120 MHz and 3220 MHz for which $K_v$ is substantially constant.

In the embodiment of FIG. 5a, the RF output signal is provided by the drain (D) terminal. In contrast, in the embodiment of FIG. 5b, the RF output signal is provided by the source (S) terminal. In either embodiment, the oscillator 42 can also include a pad attenuator 60 to isolate the oscillator and to prevent frequency pulling due to non-ideal loading conditions. Moreover, the oscillator can include a blocking capacitor for preventing DC current from flowing into the pad attenuator.

As depicted by FIGS. 5a and 5b, the oscillator 42 can be configured in different manners even in instances in which the oscillators include the same type of transistor 44, namely, a field effect transistor. Additionally, additional embodiments of the oscillator include other types of transistors, such as a heterojunction bipolar transistor. In those embodiments in which the oscillator includes a hetrojunction bipolar transistor, the hetrojunction bipolar transistor can be inserted in place of the field effect transistor of FIGS. 5a and 5b with the emitter terminal replacing the source (S) terminal, the base terminal replacing the gate (G) terminal and the collector terminal replacing the drain (D) terminal. Moreover, the embodiments of the oscillator 42 depicted in FIGS. 5a and 5b are both common gate series configurations. However, the voltage controlled oscillator can have any of the other oscillator configurations appropriate for high frequency applications as described by Brian Kormanyos et al., *Oscillator Designed for Maximum Added Power,* IEEE Microwave and Guided Wave Letters, Vol. 4, No. 6, pp. 205–07 (June 1994) and K. L. Kotzebue et al., *The Use of Large Signal S-Parameters in Microwave Oscillator Design,* Proc. Int. Microwave Symp. on Circuits and Systems (1975), the contents of both of which are incorporated herein by reference.

Figure 12:
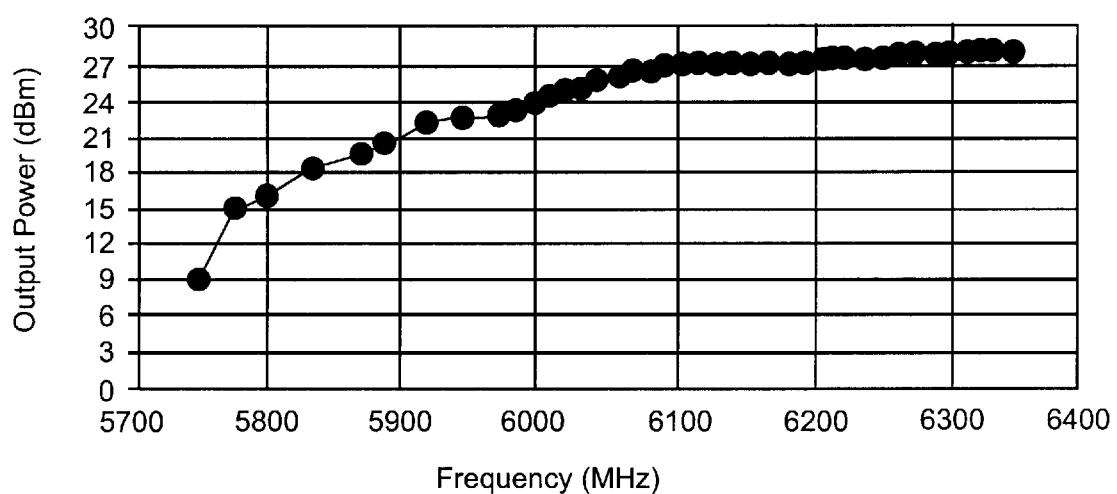
FIG. 12 is a graphical representation of the output power of an oscillator of one embodiment of the present invention that includes a transistor formed of AlGaN and GaN and that is operating at 6 GHz.
Figure 13:
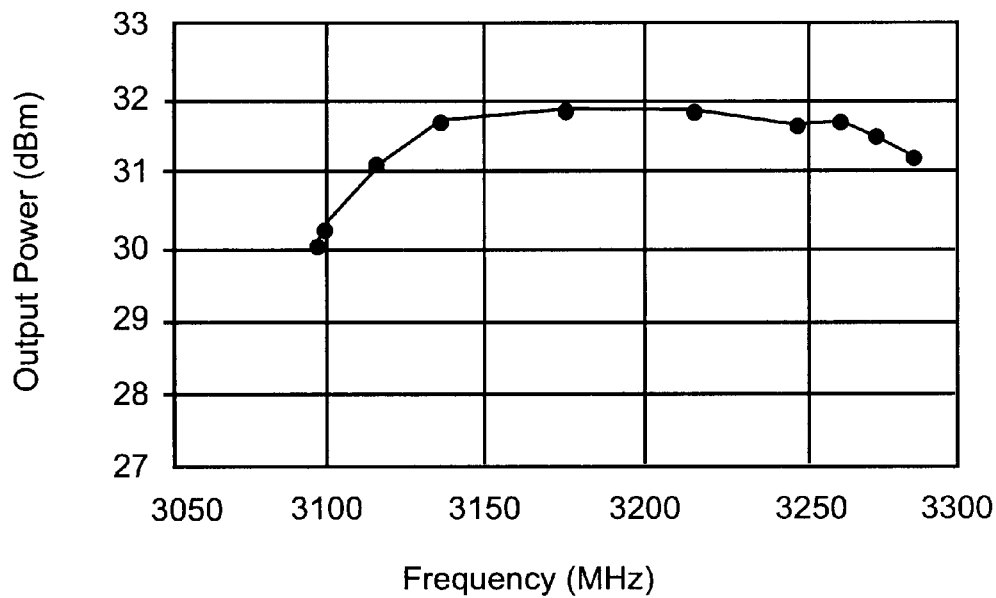
FIG. 13 is a graphical representation of the output power of an oscillator of another embodiment of the present invention that includes a transistor formed of AlGaN and GaN and that is operating at about 3 GHz.

The oscillator 42 of the present invention can produce RF output signals having a relatively large output power. For example, the oscillator of the embodiment described above with a nominal oscillation frequency of 6 GHz produces RF output signals having an output power level of about 27 dBm at frequencies above about 6 GHz as depicted in FIG. 12. Similarly, the oscillator of the other embodiment described above with a nominal oscillation frequency of 3 GHz produces RF output signals having an output power approaching 32 dBm at frequencies between 3150 MHz and 3250 MHz as depicted in FIG. 13. In contrast, conventional oscillators generally produce output power levels in the milliwatt range.

Figure 14:
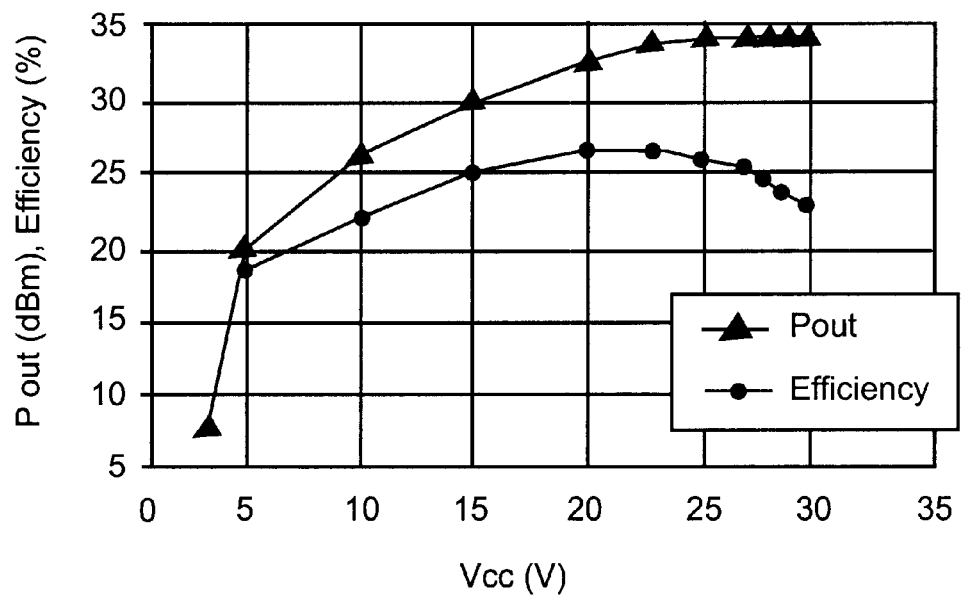
FIG. 14 is a graphical representation of the output power and efficiency of an oscillator of one embodiment of the present invention that includes a transistor formed of AlGaN and GaN and that is operating at 3 GHz over a range of supply voltages.

Not only does the oscillator 42 of the present invention produce RF output signals having a relatively high power level, but the oscillator of the present invention produces the relatively high output levels in an efficient manner. In this regard, both the output power $P_{out}$ and the efficiency, defined as the output power $P_{out}$ divided by the input power $P_{in}$, produced by the oscillator of the embodiment described above that has a nominal oscillation frequency of 3 GHz are depicted in FIG. 14 for a variety of supply voltages $V_{cc}$. As shown, the transistor 44 of the oscillator effectively turns on and conducts for supply voltages of greater than about 4 volts and produces RF outlet signals having an output power level of about 35 dBm at supply voltages of 25 volts and greater. Moreover, the efficiency with which the oscillator of this embodiment produces the relatively high levels of output power exceeds 25% for supply voltages between about 15 volts and about 28 volts. For example, in instances in which the oscillator of this embodiment is provided with a supply voltage of 26 volts and a supply current of 0.38 amps, the oscillator produces RF output signals having an output power of 2.7 watts. As such, the efficiency of the oscillator of this embodiment under these operating conditions is 2.7 W/(26V×0.38 A)=27%.

In comparison, a conventional oscillator operates at efficiencies of about 10% and produces RF output signals having power levels in the milliwatt range. Accordingly, the oscillator 42 of the present invention operates in a substantially more efficient manner and produces RF output signals having significantly greater power levels, such as 100 times greater in some instances.

The oscillator 42 of the present invention can be utilized in a variety of applications. In one advantageous application, the oscillator is incorporated in a phase locked oscillator which, in turn, is incorporated in a transceiver. As described below, in embodiments in which the transceiver is utilized in signal transmission applications, the transceiver functions as an upconverter that can operate either as a saturated upconverter 64 or a linear upconverter 64. Alternatively, the transceiver can also operate in signal reception applications in which the transceiver operates as a downconverter without departing from the spirit and scope of the present invention.

Figure 1:
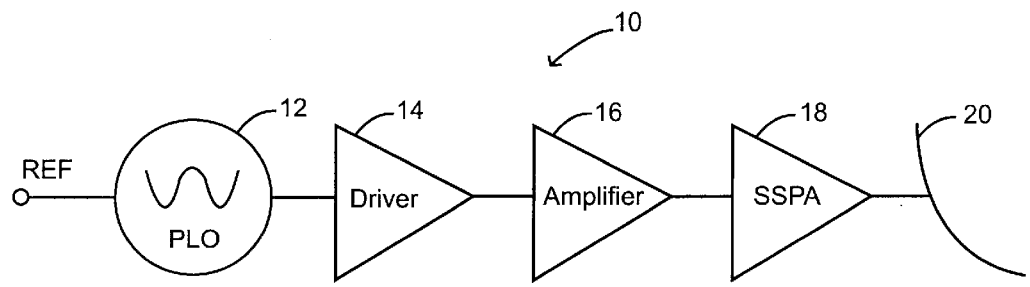
FIG. 1 is a schematic representation of a conventional saturated upconverter including a phase locked oscillator.
Figure 15:
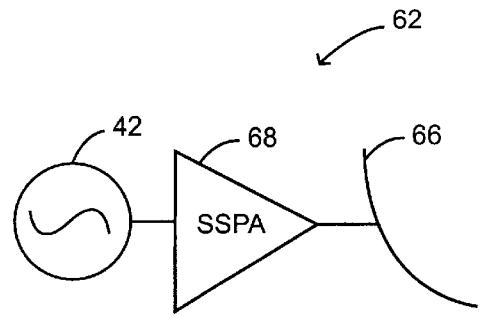
FIG. 15 is a schematic representation of a saturated upconverter according to one aspect of the present invention.

As depicted in FIG. 15, a saturated upconverter 64 according to one aspect of the present invention includes a phase locked oscillator 12 as depicted in FIG. 2 that includes a voltage controlled oscillator 42 as described above that is operating in saturation to produce an oscillating RF output signal. The saturated upconverter also includes an antenna 66 in electrical communication with the oscillator for transmitting the oscillating RF output signal. As a result of the relatively high power levels of the oscillating RF output signal, the oscillating RF output signal need not be amplified prior to being transmitted by the antenna. Accordingly, the saturated upconverter need not include one or more drivers and/or one or more amplifiers as required by conventional upconverters, such as the upconverter depicted in FIG. 1. Although not necessary for the practice of this aspect of the present invention, the saturated upconverter can include a switching element, 68 such as a solid state power amplifier, disposed between the oscillator and the antenna. In this embodiment, the solid state power amplifier serves not to amplify the RF output signals, but to switchably connect the output of the transistor 44 to the antenna in order to isolate the oscillator, if desired.

Figure 3:
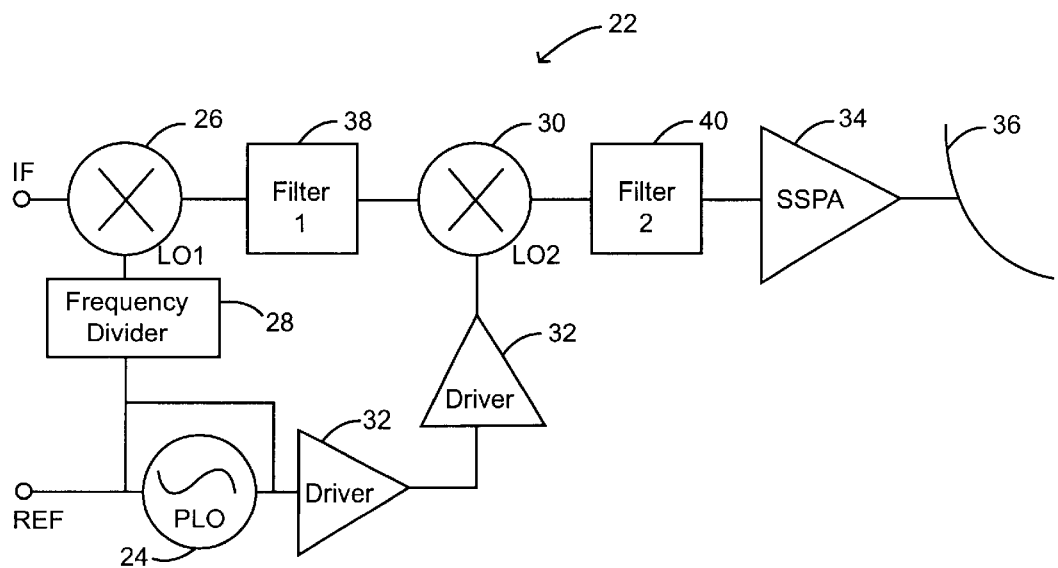
FIG. 3 is a schematic representation of a conventional linear upconverter including a phase locked oscillator.
Figure 16:
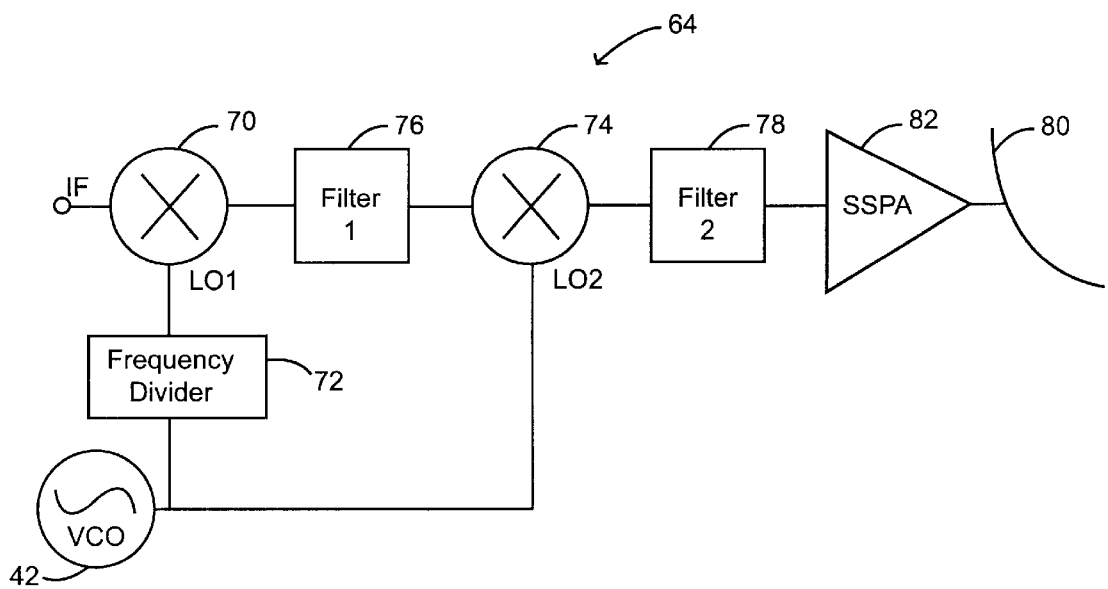
FIG. 16 is a schematic representation of a linear upconverter according to another aspect of the present invention.

As depicted in FIG. 16, a linear upconverter 64 can also be provided according to another aspect of the present invention that includes a phase locked oscillator as depicted in FIG. 2 that includes a voltage controlled oscillator 42 as described above that is operating in a linear mode. In addition to the oscillator, the linear upconverter includes a first mixer 70 for mixing an input signal having an intermediate frequency with a signal derived from the output of the phase locked oscillator. In the illustrated embodiment, for example, the linear upconverter can include a frequency alteration element, such as a frequency divider 72, disposed between the output of the phase locked oscillator and the first mixer for reducing the frequency of the RF output signal provided by the phase locked oscillator. The signal derived from the oscillating RF output signal provided by the phase locked oscillator therefor serves as a first local oscillator signal (LO1) for the first mixer 1P. The linear upconverter 64 of this embodiment also includes a second mixer 74 for receiving the output of the first mixer as well as a signal derived from the oscillating RF output signal provided by the phase locked oscillator 42. While another frequency alteration element, such as a frequency multiplier, could be disposed between the output of the phase locked oscillator and the second mixer in addition to or instead of the frequency alteration element disposed between the output of phase locked oscillator and the first mixer, the oscillating RF output signal provided by the phase locked oscillator is provided directly to the second mixer in the illustrated embodiment, thereby serving as a second local oscillator signal (LO2). As a result of the relatively high power level of the oscillating RF output signal provided by the voltage controlled oscillator, the linear upconverter need not include one or more drivers and/or more amplifiers between the output of the oscillator and the second mixer as required by conventional linear upconverters, such as the upconverter depicted in FIG. 3. Similarly, the linear upconverter need not include one or more drivers and/or amplifiers between the output of the oscillator and the first mixer as commonly utilized by conventional linear upconverters.

As also depicted in FIG. 16, the linear upconverter 64 can further include a first filter 76 disposed between the first and second mixers 70, 74 for blocking the first local oscillator signal L01, that is, the signal derived from the oscillating RF output signal provided by phase locked oscillator 42. Similarly, the linear upconverter can include a second filter 78 for receiving the output of the second mixer and for blocking the second oscillator signal L02, that is, the signal derived from the output of the phase locked oscillator. In addition, the linear upconverter can include an antenna 80 for receiving and transmitting the filtered output of the second mixer. As depicted in FIG. 16, the linear upconverter can further include a switching element 82, such as a solid state power amplifier for isolating the linear upconverter.

Therefore, upconverters, both saturated and linear, are provided that can produce oscillating RF output signals of a desired frequency and power level in a more efficient manner. In this regard, the upconverters include an voltage controlled oscillator 42 that has a transistor 44 formed of a wide bandgap semiconductor material in order to produce an oscillating RF signal having a relatively high power. The upconverters therefore need not amplify the oscillating RF signal provided by the oscillator and many, if not all, of the drivers and amplifiers required by conventional upconverters can therefore be eliminated. Thus, the upconverters of the present invention need not separately bias a plurality of drivers and amplifiers and can accordingly produce an oscillating RF output signal in a more efficient manner. Moreover, the upconverters of the present invention generally include fewer components and require less bias circuitry than conventional upconverters, thereby reducing the space requirements for the upconverters and permitting the upconverters to be packaged in a more compact manner.

Figure 17:
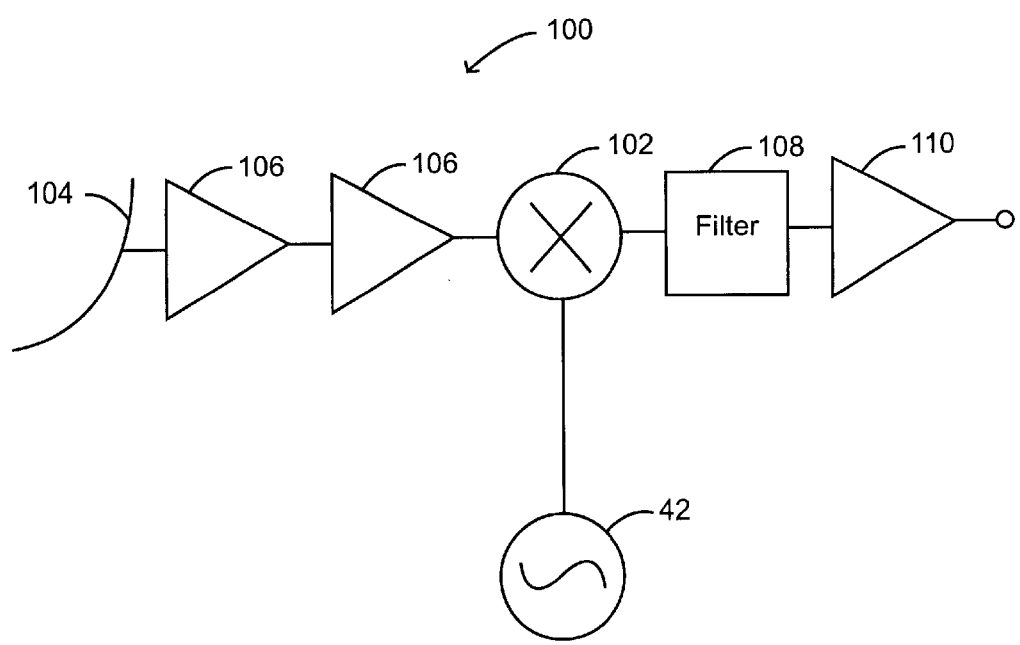
FIG. 17 is a schematic representation of a downconverter according to another aspect of the present invention.

The oscillators of the present invention can be utilized for a variety of applications including signal transmission applications involving upconversion as described above. As mentioned above, however, the voltage controlled oscillators of the present invention can also be incorporated into phase locked oscillators or dielectric resonator oscillators that operate in a linear mode to perform a downconversion function in signal reception applications. As such, one aspect of the present invention provides downconverters as shown in FIG. 17 which include voltage controlled oscillators formed of wide bandgap semiconductor materials as described herein.

In this aspect of the present invention, the downconverter 100 includes an oscillator 42, such as a phase locked oscillator that includes a voltage controlled oscillator as depicted in FIG. 2 and having a transistor formed of a wide bandgap semiconductor material. Alternatively, the oscillator can be a dielectric resonator oscillator that also includes an oscillator having a transistor formed of a wide band gap semiconductor material that is designed to oscillated at a fixed frequency. Although not depicted in FIG. 17, the oscillator would have a reference signal input in those embodiments in which the oscillator is a phase locked oscillator as will be apparent to those skilled in the art and as described-above.

The downconverter 100 of this aspect of the present invention also includes a mixer 102 for mixing the signal received by the antenna 104 with a signal derived from the output of the oscillator 42. Although the signal received by the antenna is typically amplified by one or more low noise amplifiers 106, the output of the oscillator need not be amplified prior to being provided to the mixer since the oscillator of the present invention provides output signals having much greater power levels than provided by conventional oscillators as described above. As such, the output of the oscillator is preferably provided directly to the mixer. The output of the mixer is then filtered by filter 108 and amplified by amplifier 110. Since the downconverter does not include drivers and/or amplifiers between the oscillator and the mixer and accordingly does not include the associated bias circuitry, the design of the downconverter is simplified and the space requirements are advantageously reduced in comparison to conventional downconverters. Moreover, the efficiency of the downconverter of the present invention is improved relative to conventional downconverters since no biasing is required of drivers and/or amplifiers between the oscillator and the mixer.

With respect to commercial applications, the upconverters and downconverters can be utilized in broadband terrestrial and satellite communication systems, broadcast systems, radar systems, local multi-point distribution systems (LMDS), microwave multi-point distribution systems (LMDS), wired links such as for coaxial television cable, optical fiber systems and the like. For example, wireless radio systems can advantageously include an upconverter and/or a downconverter of the present invention for producing and receiving oscillating signals, respectively. Likewise, in military applications, the upconverters can be utilized not only as transmitters, but also as radar jamming devices and the like.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An oscillator comprising:
   a transistor comprised of a semiconductor material having a wide bandgap for producing a radio frequency (RF) output signal having an output power level that exceeds 20 dBm;
   a bias supply for providing a supply voltage and a supply current to said transistor; and
   a tank circuit in electrical communication with said transistor for causing said transistor to produce an oscillating RF output signal once said transistor is provided with the supply voltage and the supply current.

2. An oscillator according to claim 1 wherein said transistor is comprised of a semiconductor material having a bandgap of at least 2.0 electron volts (eV).

3. An oscillator according to claim 2 wherein said transistor is comprised of a semiconductor material having a wide bandgap selected from the group consisting of gallium nitride (GaN), aluminum gallium nitride (AlGaN), silicon carbide (SiC) and boron nitride (BN).

4. An oscillator according to claim 1 wherein said transistor is selected from the group consisting of a field effect transistor (FET), a heterojunction bipolar transistor (HBT) and a high electron mobility transistor (HEMT).

5. An oscillator according to claim 1 wherein said transistor comprises, first, second and third terminals, and wherein said tank circuit comprises first and second reactances electrically connected to the first and second terminals of said transistor, respectively, such that said transistor is unstable.

6. An oscillator according to claim 1 wherein said tank circuit further comprises a varactor electrically connected to a respective reactance such that a control input is provided between said varactor and the respective reactance in order to tune the oscillating RF output signal.

7. An oscillator according to claim 1 wherein the output power level of said RF output signal is between 20 dBm and 35 dBm.

8. An oscillator according to claim 1 wherein the output power level of said oscillating RF output signal is between 20 dBm and 35 dBm.

9. A saturated up converter comprising:
   an oscillator comprising a transistor formed of a semiconductor material having a wide bandgap and operating in saturation for producing a modulated radio frequency (RF) output signal having an output power level that exceeds 20 dBm in response to a supply voltage and a supply current; and
   an antenna in electrical communication with said oscillator for transmitting the modulated RF output signal without requiring any additional amplification of the modulated RF output signal between said oscillator and said antenna.

10. A saturated upconverter according to claim 9 wherein said transistor of said oscillator is comprised of a semiconductor material having a bandgap of at least 2.0 electron volts (eV).

11. A saturated upconverter according to claim 10 wherein said transistor of said oscillator is comprised of a semiconductor material having a wide bandgap selected from the group consisting of gallium nitride (GaN), aluminum gallium nitride (AlGaN), silicon carbide (SiC) and boron nitride (BN).

12. A saturated upconverter according to claim 9 wherein said transistor of said oscillator is selected from the group consisting of a field effect transistor (FET), a heterojunction bipolar transistor (HBT) and a high electron mobility transistor (HEMT).

13. A saturated upconverter according to claim 9 wherein said oscillator further comprises a tank circuit in electrical communication with said transistor for causing said transistor to produce the RF output signal in response to the supply voltage and the supply current.

14. A saturated upconverter according to claim 13 wherein said transistor comprises, first, second and third terminals, and wherein said tank circuit comprises first and second reactances electrically connected to the first and second terminals of said transistor, respectively, such that said transistor is unstable.

15. A saturated upconverter according to claim 13 wherein said tank circuit further comprises a varactor electrically connected to a respective reactance such that a control input is provided between said varactor and the respective reactance in order to tune the RF output signal.

16. A saturated upconverter according to claim 9 wherein said oscillator further comprises a bias supply for providing the supply voltage and the supply current to said transistor.

17. A saturated upconverter according to claim 9 further comprising a switching element disposed between said oscillator and said antenna.

18. A saturated upconverter according to claim 9 wherein the output power level of said modulated RF output signal is between 20 dBm and 35 dBm.

19. A linear upconverter comprising:
an oscillator comprising a transistor formed of a semiconductor material having a wide bandgap and operating in a linear mode for producing a modulated radio frequency (RF) signal having an output power level that exceeds 20 dBm in response to a supply voltage and supply current;
a first mixer for mixing a signal having an intermediate frequency with a signal derived from the modulated RF signal to produce a first signal; and
a second mixer for mixing the first signals produced by said first mixer with another signal derived from the modulated RF signal to produce an output signal,
wherein said first and second mixers receive the respective signals derived from the modulated RF signal without requiring any additional amplification for the modulated RF signal between said oscillator and said first and second mixers.

20. A linear upconverter according to claim 19 wherein said transistor of said oscillator is comprised of a semiconductor material having a bandgap of at least 2.0 electron volts (eV).

21. A linear upconverter according to claim 20 wherein said transistor of said oscillator is comprised of a semiconductor material having a wide bandgap selected from the group consisting of gallium nitride (GaN), aluminum gallium nitride (AlGaN), silicon carbide (SiC) and boron nitride (BN).

22. A linear upconverter according to claim 19 wherein said transistor of said oscillator is selected from the group consisting of a field effect transistor (FET), a heterojunction bipolar transistor (HBT) and a high electron mobility transistor (HEMT).

23. A linear upconverter according to claim 19 wherein said oscillator further comprises a tank circuit in electrical communication with said transistor for causing said transistor to produce the RF signal in response to the supply voltage and the supply current.

24. A linear upconverter according to claim 23 wherein said transistor comprises, first, second and third terminals, and wherein said tank circuit comprises first and second reactances electrically connected to the first and second terminals of said transistor, respectively, such that said transistor is unstable.

25. A linear upconverter according to claim 23 wherein said tank circuit further comprises a varactor electrically connected to a respective reactance such that a control input is provided between said varactor and the respective reactance in order to tune the RF signal.

26. A linear upconverter according to claim 19 wherein said oscillator further comprises a bias supply for providing the supply voltage and the supply current to, said transistor.

27. A linear upconverter according to claim 19 further comprising a frequency alteration element disposed between said oscillator and a respective mixer for altering the frequency of the modulated RF signal that is produced by said oscillator and provided to the respective mixer.

28. A linear upconverter according to claim 19 further comprising an antenna, responsive to said second mixer, for transmitting the output signal produced by said second mixer.

29. A linear upconverter according to claim 28 further comprising a switching element disposed between said second mixer and said antenna.

30. A linear upconverter according to claim 28 further comprising a first filter disposed between said first and second mixers for removing the signal derived from the modulated RF signal and a second filter disposed between said second mixer and said antenna for removing the signal derived from the modulated RF signal.

31. A linear upconverter according to claim 19 wherein the output power level of said modulated RF signal is between 20 dBm and 35 dBm.

32. A downconverter according to claim 19 wherein the output power level of said RF signals is between 20 dBm and 35 dBm.

33. A downconverter comprising:
an oscillator comprising a transistor formed of a semiconductor material having a wide bandgap for producing a radio frequency (RF) signals having an output power level that exceeds 20 dBm in response to a supply voltage and a supply current;
an antenna for receiving signals; and
a mixer for mixing the signals received by said antenna with signals derived from the RF signals to produce an output signal,
wherein said mixer receives the RF signals derived from the RF signals without requiring any additional amplification of the RF signals between said oscillator and said mixer.

34. A downconverter according to claim 33 wherein said transistor of said oscillator is comprised of a semiconductor material having a bandgap of at least 2.0 electron volts (eV).

35. A downconverter according to claim 34 wherein said transistor of said oscillator is comprised of a semiconductor material having a wide bandgap selected from the group consisting of gallium nitride (GaN), aluminum gallium nitride (AlGaN), silicon carbide (SiC) and boron nitride (BN).

36. A downconverter according to claim 33 wherein said transistor of said oscillator is selected from the group consisting of a field effect transistor (FET), a heterojunction bipolar transistor (HBT) and a high electron mobility transistor (HEMT).

37. A downconverter according to claim 33 wherein said oscillator is a phase locked oscillator that further comprises a tank circuit in electrical communication with said transistor for causing said transistor to produce the RF signal in response to the supply voltage and the supply current.

38. A downconverter according to claim 37 wherein said transistor comprises, first, second and third terminals, and wherein said tank circuit comprises first and second reactances electrically connected to the first and second terminals of said transistor, respectively, such that said transistor is unstable.

39. A downconverter according to claim 37 wherein said tank circuit further comprises a varactor electrically connected to a respective reactance such that a control input is provided between said varactor and the respective reactance in order to tune the RF signal.

40. A downconverter according to claim 33 wherein said oscillator further comprises a bias supply for providing the supply voltage and the supply current to said transistor.

41. A downconverter according to claim 33 further comprising at least one amplifier disposed between said antenna and said mixer for amplifying the signals received by said antenna.

* * * * *